United States Patent
Xu et al.

(10) Patent No.: US 9,735,114 B1
(45) Date of Patent: Aug. 15, 2017

(54) METHOD OF PACKAGING SEMICONDUCTOR DEVICE

(71) Applicant: DELTA ELECTRONICS INT'L (SINGAPORE) PTE LTD, Singapore (SG)

(72) Inventors: Xiaofeng Xu, Singapore (SG); Beng Beng Lim, Singapore (SG); Yiu Wai Lai, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/391,631

(22) Filed: Dec. 27, 2016

(30) Foreign Application Priority Data

Oct. 19, 2016 (SG) .............................. 10201608773P

(51) Int. Cl.
| | |
|---|---|
| *H01L 21/56* | (2006.01) |
| *H01L 23/498* | (2006.01) |
| *H01L 23/48* | (2006.01) |
| *H01L 21/48* | (2006.01) |
| *H01L 23/538* | (2006.01) |

(52) U.S. Cl.
CPC ........ *H01L 23/5389* (2013.01); *H01L 21/486* (2013.01); *H01L 21/4857* (2013.01); *H01L 21/4864* (2013.01); *H01L 23/5383* (2013.01); *H01L 23/5384* (2013.01); *H01L 23/5386* (2013.01)

(58) Field of Classification Search
None
See application file for complete search history.

(56) References Cited

U.S. PATENT DOCUMENTS

| 8,461,689 | B2 | 6/2013 | Chia | |
|---|---|---|---|---|
| 9,318,442 | B1 * | 4/2016 | Chen | ...................... H01L 21/486 |
| 9,391,027 | B2 * | 7/2016 | Chauhan | ................. H01L 24/26 |
| 9,455,218 | B2 * | 9/2016 | Ooi | ........................ H01L 23/498 |

* cited by examiner

*Primary Examiner* — Khaja Ahmad
(74) *Attorney, Agent, or Firm* — Kirton McConkie; Evan R. Witt

(57) ABSTRACT

A first insulation layer comprising stacked prepreg layers is provided, and a metallic protective layer is formed on the first insulation layer. A first alignment mark is formed on the first insulation layer, and an accommodation cavity is formed in the first insulation layer according to the first alignment mark. A second alignment mark is formed on the first insulation layer according to the first alignment mark. A carrier plate is attached on the first insulation layer through a thermal release tape layer, and the semiconductor device is temporarily fixed on the thermal release tape layer within the accommodation cavity according to the second alignment mark. A semi-cured second insulation layer is placed over the first insulation layer, and the second insulation layer is laminated and cured. A re-distribution layer is formed on the second insulation layer, and the re-distribution layer is electrically connected with the semiconductor device.

16 Claims, 6 Drawing Sheets

METHOD OF PACKAGING
SEMICONDUCTOR DEVICE

FIELD OF THE INVENTION

The present invention relates to a packaging method, and more particularly to a method of packaging at least one electronic component.

BACKGROUND OF THE INVENTION

Recently, the general trend in designing electronic devices is toward small size, light weight and easy portability. Moreover, with increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a motherboard or a system circuit board.

Nowadays, an embedded package structure is widely adopted because of many advantages such as smaller footprint, lower profile, higher power density, better thermal management, lower electrical noise and large-scale packaging solution.

For example, a conventional embedded package structure was disclosed in U.S. Pat. No. 8,461,689. For precisely embedding an electronic component within a substrate, a metallic frame is formed on a surface of the substrate. The metallic frame is arranged around the periphery of an opening that is configured for embedding the electronic component. Consequently, the shape of the opening by laser ablation is controlled through the metallic frame. Since it is necessary to additionally form the metallic frame on the substrate, the conventional embedded package structure is not cost-effective.

Moreover, while the electronic component is disposed within the opening of the substrate of the conventional embedded package structure, the electronic component will be attached to the substrate using conductive or non-conductive paste, which is not cost efficient.

Therefore, there is a need of providing an improved packaging process in order to eliminate the above drawbacks.

SUMMARY OF THE INVENTION

An objective of the present invention is to provide a packaging method for reducing the fabrication cost of the package structure.

An aspect of the present invention provides a method of packaging a semiconductor device. Firstly, a first insulation layer comprising stacked prepreg layers is provided, and then a metallic protective layer is formed on a first surface of the first insulation layer. Subsequently, a first alignment mark is formed on the first insulation layer, and then an accommodation cavity is formed in the first insulation layer according to the first alignment mark. Afterward, a second alignment mark is formed on a second surface of the first insulation layer according to the first alignment mark. Next, a carrier plate is attached on the first surface of the first insulation layer through a thermal release tape layer, and the semiconductor device is temporarily fixed on the thermal release tape layer within the accommodation cavity according to the second alignment mark. Then, a semi-cured second insulation layer is placed over the second surface of the first insulation layer, and the second insulation layer is laminated and cured. After the carrier plate and the thermal release tape layer are removed, a re-distribution layer is formed on the second insulation layer, and the re-distribution layer is electrically connected with the semiconductor device.

The above contents of the present invention will become more readily apparent to those ordinarily skilled in the art after reviewing the following detailed description and accompanying drawings, in which:

DETAILED DESCRIPTION OF THE
PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a method of packaging one or more electronic components.

Figure 1A:
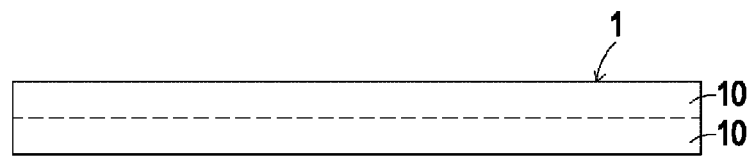
FIGS. 1A to 1N are schematic cross-sectional views illustrating a method of packaging an electronic component according to an embodiment of the present invention.
Figure 1B:
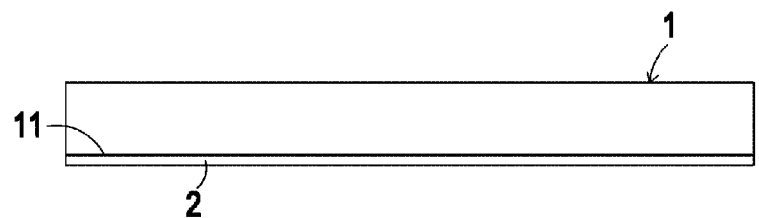
Figure 1C:
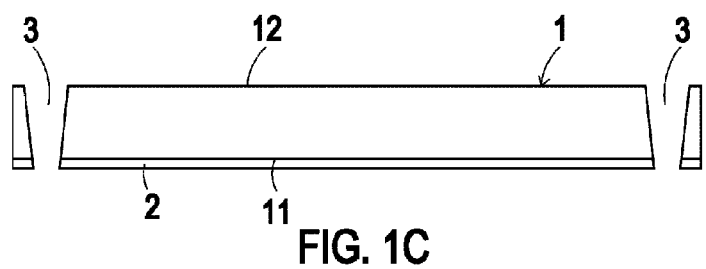
Figure 1D:
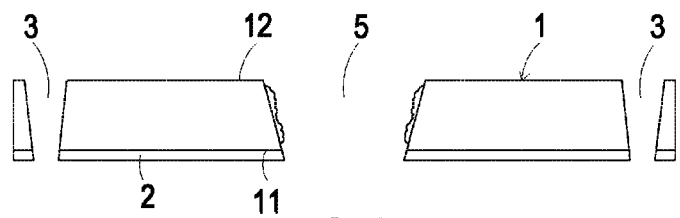
Figure 1E:
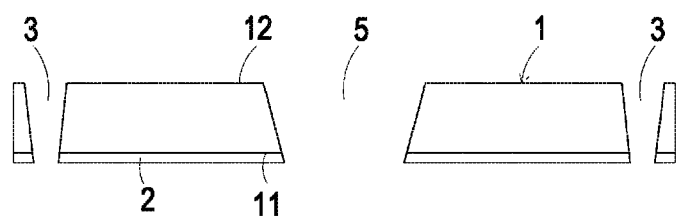
Figure 1F:
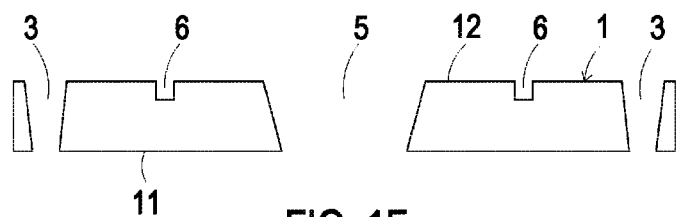
Figure 1G:
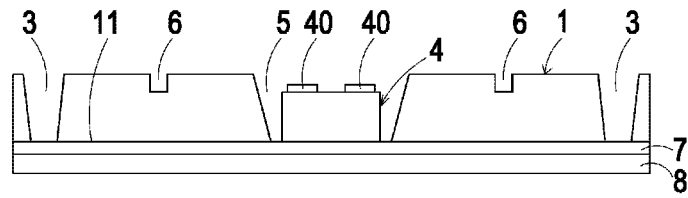
Figure 1H:
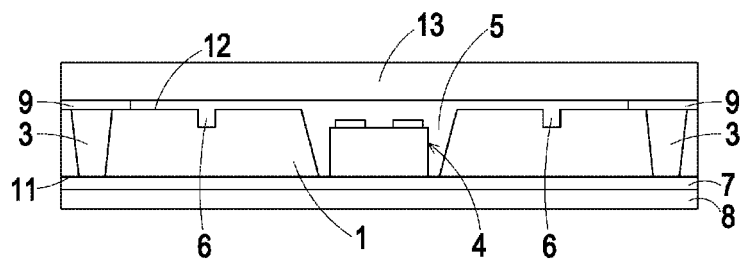
Figure 1I:
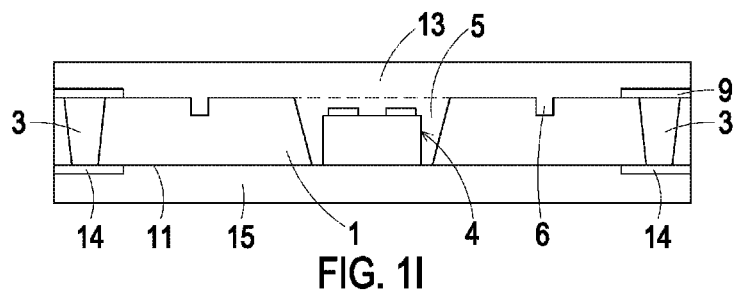
Figure 1J:
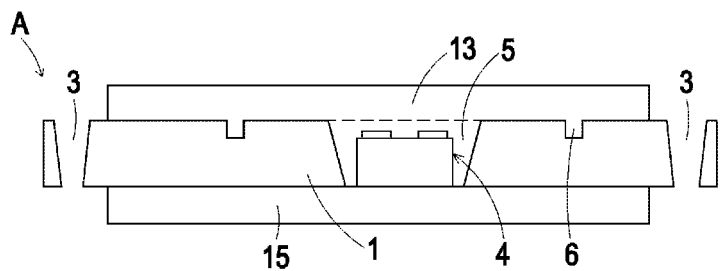
Figure 1K:
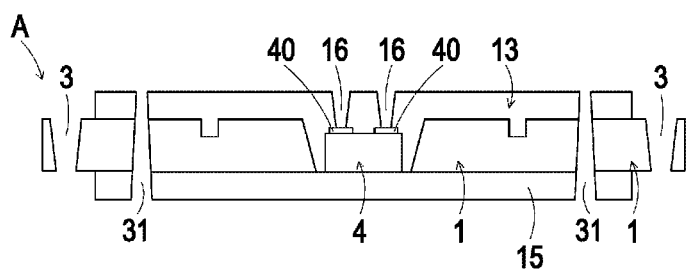
Figure 1L:
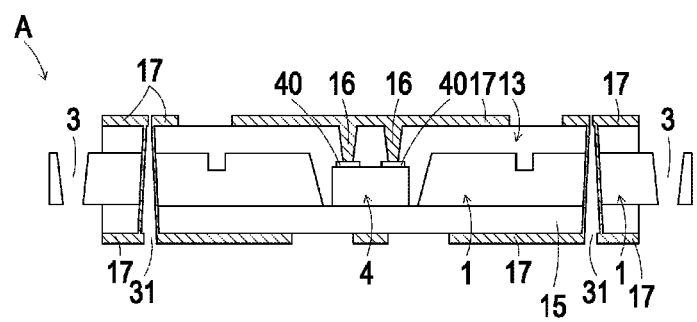
Figure 1M:
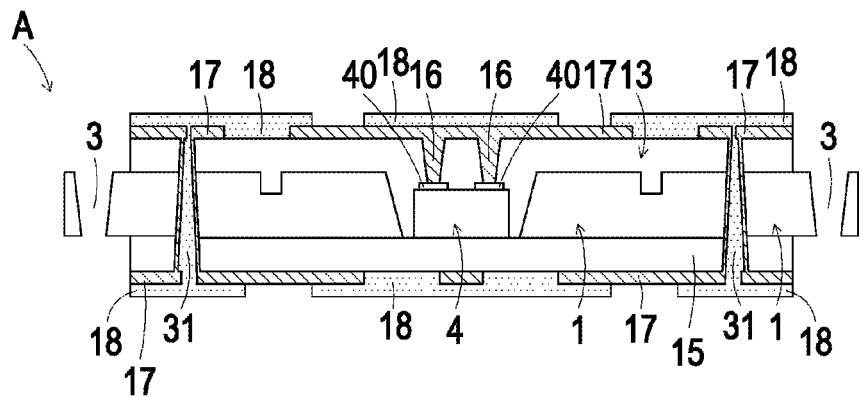
Figure 1N:
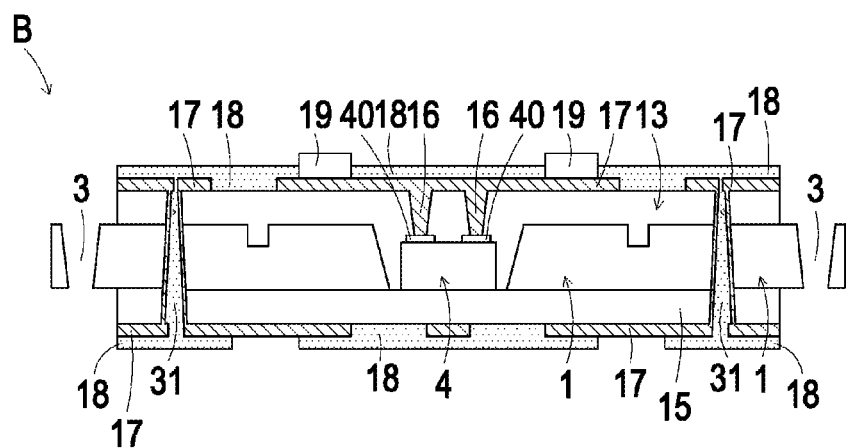
Figure 2:
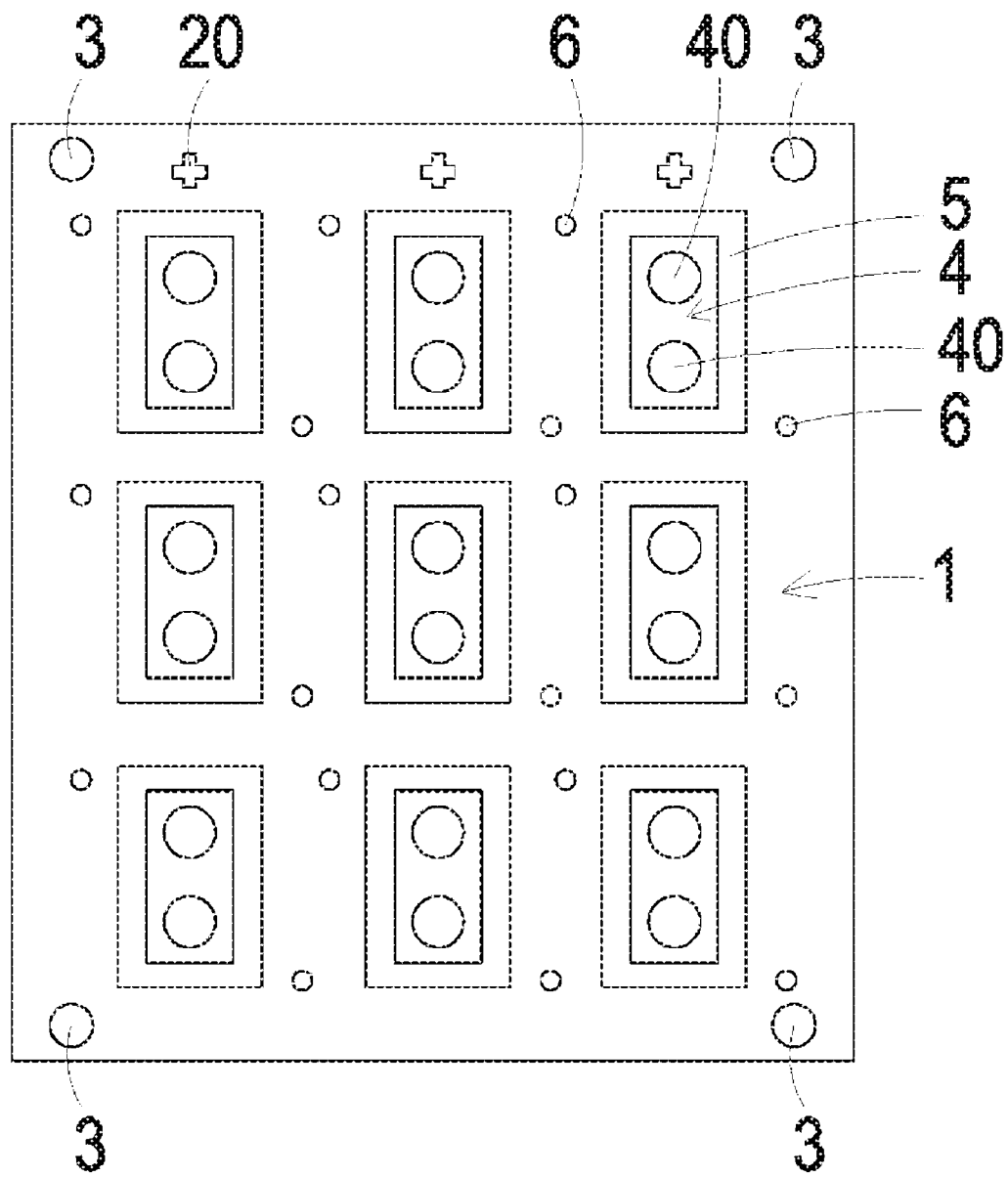
FIG. 2 is a top view illustrating a semi-finished package structure of plural electronic components after the step of FIG. 1G is completed.

FIGS. 1A to 1N are schematic cross-sectional views illustrating a method of packaging an electronic component according to an embodiment of the present invention. FIG. 2 is a top view illustrating a semi-finished package structure of plural electronic components after the step of FIG. 1G is completed. The packaging process comprises the following steps.

Please refer to FIG. 1A. Firstly, a first insulation layer 1 comprising plural stacked prepreg layers 10 is provided, and the first insulation layer 1 is formed by laminating and curing the plural prepreg layers 10. As shown in FIG. 1A, the first insulation layer 1 is a stack structure with two prepreg layers 10. Moreover, each prepreg layer 10 is made of glass cloth reinforced epoxy, or any other appropriate insulation material with low coefficient of thermal expansion (CTE) and good thermal conductivity.

Then, as shown in FIG. 1B, a metallic protective layer 2 is formed on a first surface 11 of the first insulation layer 1 by a sputtering process. In an embodiment, the thickness of the metallic protective layer 2 is smaller than 1 µm. Preferably but not exclusively, the metallic protective layer 2 is made of copper.

Next, please refer to FIG. 1C and also FIG. 2. A first alignment mark 3 is formed on the first insulation layer 1, and the first alignment mark 3 comprises plural fiducial holes. In an embodiment, a laser drilling process is performed on the second surface 12 of the first insulation layer 1 to form four fiducial holes which run through the first insulation layer 1 and the metallic protective layer 2. Moreover, the four fiducial holes of the first alignment mark 3 are used as laser-drilling alignment marks and collaboratively defined as a coordinate system. Since the four fiducial holes of the first alignment mark 3 are used as the alignment marks to provide initial alignment of the laser device, the laser device can locate the positions to be drilled according to the coordinate system defined by the four fiducial holes of the first alignment mark 3. In an embodiment, the first insulation layer 1 has a rectangular shape (see FIG. 2). Moreover, the four fiducial holes of the first alignment mark 3 are located adjacent to the four corners of the first insulation layer 1. It is noted that the positions of the four fiducial holes of the first alignment mark 3 may be varied according to the shape of the first insulation layer 1. In another embodiment, the first alignment mark 3 is formed through a mechanical drilling process and comprises openings with designed shapes or sizes, such as line-shaped or cross-shaped.

Next, please refer to FIG. 1D. The second surface 12 of the first insulation layer 1 is laser drilled or mechanical drilled to form an accommodation cavity 5 according to the coordinate system defined by the first alignment mark 3. The accommodation cavity 5 run through the first insulation layer 1 and the metallic protective layer 2. The accommodation cavity 5 is used for accommodating an electronic component 4 (see FIG. 1G). The size of the accommodation cavity 5 is larger than the size of the electronic component 4.

Then, as shown in FIGS. 1E and 1F, in one embodiment, a desmearing process is first performed to remove the contaminant retained in the accommodation cavity 5 after laser or mechanical drilling process. By the desmearing process, the second surface 12 of the first insulation layer 1 also becomes rough. Since the metallic protective layer 2 is formed on the first surface 11 of the first insulation layer 1, the first surface 11 of the first insulation layer 1 is not roughened. After the desmearing process is completed, the metallic protective layer 2 is removed.

Next, the second surface 12 of the first insulation layer 1 is laser drilled or mechanical drilled to form at least one second alignment mark 6 according to the coordinate system. The second alignment mark 6 is arranged around the accommodation cavity 5 (see also FIG. 2) so as to improve the alignment precision in a followed die bond process. In this embodiment, the second alignment mark 6 is an indentation that is drilled from the second surface 12 of the first insulation layer 1 and in a direction toward the first surface 11 of the first insulation layer 1. It is noted that the number of the second alignment mark 6 may be varied according to the number of the electronic components 4. In an embodiment, one electronic component 4 corresponds to two second alignment marks 6. Preferably but not exclusively, the two second alignment marks 6 are arranged along a diagonal of the periphery of the accommodation cavity 5. In another embodiment, the second alignment marks 6 are formed before the desmearing process.

Next, please refer to FIG. 1G. A carrier plate 8 is attached on the first surface 11 of the first insulation layer 1 through a thermal release tape layer 7. Moreover, the electronic component 4 is accommodated within the accommodation cavity 5 according to the second alignment mark 6. A first side of the electronic component 4 is contacted with the thermal release tape layer 7. Since the first surface of the electronic component 4 is adhered on the thermal release tape layer 7, the electronic component 4 is temporarily fixed on the thermal release tape layer 7.

In an embodiment, the electronic component 4 comprises at least one conducting terminal 40. The at least one conducting terminal 40 is located at a second side of the electronic component 4. The electronic component 4 comprises a semiconductor device being an active component or a passive component, such as a power switch. An example of the electronic component 4 includes but is not limited to an integrated chip (IC), an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The number of the conducting terminals 40 of the electronic component 4 is determined according to the type and structure of the electronic component 4.

Then, as shown in FIG. 1H, at least one first tape 9 is attached on the second surface 12 of the first insulation layer 1 to cover a first side of the first alignment mark 3. Then, a second insulation layer 13 that is semi-cured is disposed over the second surface 12 of the first insulation layer 1 to cover the first tape 9 and the first insulation layer 1. Preferably but not exclusively, the second insulation layer 13 is a stack structure with plural prepreg layers.

Next, please refer to FIG. 1I. After the second insulation layer 13 is laminated and cured, the carrier plate 8 and the thermal release tape layer 7 are removed. While the second insulation layer 13 is laminated, a portion of the second insulation layer 13 is filled in the remaining space of the accommodation cavity 5 and the second alignment mark 6. Consequently, the electronic component 4 is securely fixed by the second insulation layer 13. Since the first tape 9 is disposed on the second surface 12 of the first insulation layer 1 to cover the first alignment mark 3, the portion of the second insulation layer 13 is stopped from entering the first alignment mark 3 by the first tape 9. Optionally, after the second insulation layer 13 is laminated and cured, the first tape 9 is removed.

Moreover, after the carrier plate 8 and the thermal release tape layer 7 are removed, at least one second tape 14 is attached on the first surface 11 of the first insulation layer 1 to cover a second side of the first alignment mark 3. Then, a semi-cured third insulation layer 15 is disposed on the first surface 11 of the first insulation layer 1. After the third insulation layer 15 is laminated and cured, the second tape 14 is removed. The function of the second tape 14 is similar to that of the first tape 9, and is not redundantly described herein. It is noted that numerous modifications and alterations may be made as long as the second insulation layer lamination is retained. In some embodiments, the steps of removing the first tape 9 and the second tape 14 are performed after the second insulation layer 13 and the third insulation layer 15 are cured.

After the above steps, a semi-finished package structure A as shown in FIG. 1J is produced. In some embodiments, the step of attaching the second tape 14 on the first surface 11 of the first insulation layer 1 and the step of forming the semi-cured third insulation layer 15 on the first surface 11 of the first insulation layer 1 are omitted. In the following embodiment, the semi-finished package structure A comprising the second tape 14 and the third insulation layer 15 will be illustrated.

Afterwards, a re-distribution process is performed to form a re-distribution layer on the first insulation layer 1 or the second insulation layer 13, and the re-distribution layer is electrically connected with the electronic component 4. The re-distribution process will be described with reference to FIGS. 1K, 1L, 1M and 1N.

Please refer to FIG. 1K. The second insulation layer 13 is laser drilled or mechanical drilled to form at least one via 16 corresponding to the at least one conducting terminal 40 of the electronic component 4. Moreover, at least one through-hole 31 is formed in the semi-finished package structure A and at the position near the electronic component 4. Preferably but not exclusively, the through-hole 31 is formed by a laser drilling process; for example, the through-hole 31 may also be formed by a mechanical drilling process. The through-hole 31 can be drilled from either side of the semi-finished package structure A depending on the layout design. In the following embodiment, the through-hole 31 is drilled from the surface of third insulation layer 15 and run through the first insulation layer 1 and the second insulation layer 13. Another set of cross alignment marks 20 (as shown in FIG. 2) is provided for mask alignment in the subsequent processes which involve photolithography processes to form patterns.

Next, please refer to FIG. 1L. A plating process is performed to form a metal layer 17 on a part of the second insulation layer 13, a part of the third insulation layer 15 and the inner surface of the through-hole 31 and fill the metal layer 17 in the via 16. Since the via 16 is aligned with the conducting terminal 40 of the electronic component 4, the metal layer 17 is contacted with the conducting terminal 40 of the electronic component 4.

Then, as shown in FIG. 1M, a fourth insulation layer 18 is partially formed on two opposite surfaces of the semi-finished package structure A, wherein a part of the metal layer 17 is exposed. That is, the fourth insulation layer 18 is formed on a part of the metal layer 17, a part of the second insulation layer 13 and a part of the third insulation layer 15, and filled in the through-hole 31. In an embodiment, the fourth insulation layer 18 is made of photosensitive resin.

Then, as shown in FIG. 1N, at least one conductive pattern 19 is plated on a part of the metal layer 17 that is contacted with the conducting terminal 40 of the electronic component 4. Meanwhile, the package structure B of the electronic component is produced.

The packaging method of the present invention is also suitable to package plural electronic components 4. A semi-finished package structure of plural electronic components after the step of FIG. 1G is shown in FIG. 2. In this embodiment, the numbers of the accommodation cavities 5, the second alignment marks 6 and the vias 16 are determined according to the number of the electronic components 4.

From the above descriptions, the present invention provides a method of packaging at least one electronic component. Firstly, the first insulation layer is laser drilled to form the first alignment mark. The first alignment mark is used as a laser-drilling alignment mark and collaboratively defined as a coordinate system. Then, the first insulation layer is laser drilled to form at least one second alignment mark according to the coordinate system. According to the second alignment mark, the electronic component is precisely placed within the accommodation cavity. For positioning the electronic component of the conventional embedded package structure, it is necessary to form a metallic frame on the surface of the substrate to control the shape of the laser-ablated opening. Since the metallic frame is omitted according to the packaging method of the present invention, the fabrication cost is reduced. In addition, the packaging method of the present invention does not need the paste to attach the electronic component to the substrate, which also reduces the fabrication cost. Moreover, after the semi-cured first insulation layer is laminated and cured, the electronic component is placed within the accommodation cavity of the first insulation layer. Since the first insulation layer has been cured when the electronic component is placed within the accommodation cavity of the first insulation layer, the subsequent laminating action will not result in obvious deformation of the first insulation layer. Under this circumstance, the electronic component is not shifted. In other words, the performance of the package structure produced by the packaging method of the present invention is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of packaging a semiconductor device, comprising:
    providing a first insulation layer comprising stacked prepreg layers;
    forming a metallic protective layer on a first surface of the first insulation layer;
    forming a first alignment mark on the first insulation layer;
    forming an accommodation cavity in the first insulation layer according to the first alignment mark;
    forming a second alignment mark on a second surface of the first insulation layer;
    attaching a carrier plate on the first surface of the first insulation layer through a thermal release tape layer;
    temporarily fixing the semiconductor device on the thermal release tape layer within the accommodation cavity according to the second alignment mark;
    placing a semi-cured second insulation layer over the second surface of the first insulation layer, and laminating and curing the second insulation layer;
    removing the carrier plate and the thermal release tape layer; and
    forming a re-distribution layer on the second insulation layer, the re-distribution layer being electrically connected with the semiconductor device.

2. The method according to claim 1, wherein the first insulation layer is formed by laminating and curing the stacked prepreg layers.

3. The method according to claim 1, wherein a thickness of the metallic protective layer is smaller than 1 μm.

4. The method according to claim 1, wherein the metallic protective layer is made of copper.

5. The method according to claim 1, wherein the metallic protective layer is formed by a sputtering process.

6. The method according to claim 1, wherein the first alignment mark comprises plural fiducial holes.

7. The method according to claim 6, wherein the plural fiducial holes are four fiducial holes which are respectively located adjacent to the four corners of the first insulation layer.

8. The method according to claim 6, wherein the plural fiducial holes run through the first insulation layer and the metallic protective layer.

9. The method according to claim 1, wherein the accommodation cavity runs through the first insulation layer and the metallic protective layer.

10. The method according to claim 1, wherein the second alignment mark is arranged around the accommodation cavity.

11. The method according to claim 1, wherein the first alignment mark, the accommodation cavity and the second alignment mark are formed by laser drilling or mechanical drilling.

12. The method according to claim 1, wherein after the step of forming the accommodation cavity, the method further comprises steps of:
  performing a desmearing process to remove contaminant retained in the accommodation cavity and roughen the second surface of the first insulation layer; and
  removing the metallic protective layer.

13. The method according to claim 1, wherein before the step of placing the second insulation layer over the second surface of the first insulation layer, the method further comprises a step of attaching at least one first tape on the second surface of the first insulation layer to cover a first side of the first alignment mark.

14. The method according to claim 13, wherein after the step of removing the carrier plate and the thermal release tape layer, the method further comprises steps of:
  attaching at least one second tape on the first surface of the first insulation layer to cover a second side of the first alignment mark;
  placing a semi-cured third insulation layer on the first surface of the first insulation layer to cover the second tape;
  laminating and curing the third insulation layer; and
  removing the first tape and the second tape, so that a semi-finished package structure is produced.

15. The method according to claim 14, wherein the step of forming the re-distribution layer comprises steps of:
  forming at least one via corresponding to at least one conducting terminal of the semiconductor device in the second insulation layer by a laser drilling or mechanical drilling process, and forming at least one through-hole in the semi-finished package structure and near the semiconductor device by a laser drilling or mechanical drilling process, wherein the through-hole runs through the second insulation layer, the first insulation layer and the third insulation layer;
  forming a metal layer on a part of the second insulation layer, a part of the third insulation layer and an inner surface of the through-hole, and filling the metal layer in the via;
  forming a fourth insulation layer on two opposite surfaces of the semi-finished package structure, and exposing a part of the metal layer; and
  forming at least one conductive pattern on a part of the metal layer, and allowing the at least one conductive pattern to be electrically connected with the corresponding conducting terminal of the semiconductor device.

16. The method according to claim 1, wherein the semiconductor device comprises a power switch.

* * * * *